USO10451356B2

(12) United States Patent
Stellman et al.

(10) Patent No.: US 10,451,356 B2
(45) Date of Patent: Oct. 22, 2019

(54) LOST WAX CAST VAPOR CHAMBER DEVICE

(71) Applicant: Microsoft Technology Licensing, LLC, Redmond, WA (US)

(72) Inventors: Jeffrey Taylor Stellman, Seattle, WA (US); Kurt Allen Jenkins, Sammamish, WA (US); Lincoln M. Ghioni, Redmond, WA (US); Andrew Douglas Delano, Woodinville, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 260 days.

(21) Appl. No.: 15/373,332

(22) Filed: Dec. 8, 2016

(65) Prior Publication Data

US 2018/0164042 A1  Jun. 14, 2018

(51) Int. Cl.
*F28F 7/00* (2006.01)
*F28D 15/04* (2006.01)
(Continued)

(52) U.S. Cl.
CPC ............. *F28D 15/046* (2013.01); *B22C 9/02* (2013.01); *B22C 9/043* (2013.01); *B22D 19/02* (2013.01);
(Continued)

(58) Field of Classification Search
CPC ......... F28D 15/046; B22C 9/043; B22C 9/02; B22D 19/02; C25D 5/10; C25D 1/02;
(Continued)

(56) References Cited

U.S. PATENT DOCUMENTS 4,854,368 A * 8/1989 Vezirian ................. B22C 9/043
164/34
5,283,715 A * 2/1994 Carlsten ............. H05K 7/20336
165/104.33
(Continued)

FOREIGN PATENT DOCUMENTS

CN        201269711 Y    7/2009
CN        203561015 U    4/2014

OTHER PUBLICATIONS

Meyer, George, "Integrating Vapor Chambers into Heatsinks", Published on: Oct. 13, 2014 Available at: http://celsiainc.com/blog-integrating-vapor-chambers-into-heatsinks/.
(Continued)

*Primary Examiner* — Claire E Rojohn, III
(74) *Attorney, Agent, or Firm* — Alleman Hall Creasman & Tuttle LLP

(57) ABSTRACT

A lost wax cast vapor chamber device is provided. Once a mesh is produced, a meltable core is formed from a meltable core material with the mesh positioned at least partially inside the core. Over the meltable core a metallic layer is formed, at least partially surrounding the meltable core. A chamber formed by the metallic layer is exposed by melting the meltable core to cause it to be removed from an internal void of the chamber, the internal void encapsulating the mesh. The melted material from the meltable core flows out an opening on at least one surface of the chamber. Subsequently, the internal void is filled at least partially with a working fluid and the opening is closed. The mesh supports the surfaces of the chamber against deformation under the vacuum of the internal void. Movement of working fluid by capillary action is facilitated by the mesh.

10 Claims, 10 Drawing Sheets

(51) Int. Cl.
*C25D 1/00* (2006.01)
*H05K 7/20* (2006.01)
*B22C 9/02* (2006.01)
*C25D 1/02* (2006.01)
*C25D 5/02* (2006.01)
*G06F 1/20* (2006.01)
*B22C 9/04* (2006.01)
*B22D 19/02* (2006.01)
*C25D 5/10* (2006.01)

(52) U.S. Cl.
CPC ............... *C25D 1/00* (2013.01); *C25D 1/02* (2013.01); *C25D 5/02* (2013.01); *C25D 5/10* (2013.01); *G06F 1/203* (2013.01); *H05K 7/20309* (2013.01); *H05K 7/20318* (2013.01); *H05K 7/20336* (2013.01); *H05K 7/20409* (2013.01); *G06F 2200/201* (2013.01)

(58) Field of Classification Search
CPC ..... C25D 5/02; G06F 1/203; G06F 2200/201; H05K 7/20336; H05K 7/20409; H05K 7/20309
See application file for complete search history.

(56) References Cited

U.S. PATENT DOCUMENTS

| | | | | |
|---|---|---|---|---|
| 6,082,443 | A * | 7/2000 | Yamamoto | F28D 15/0233 165/104.21 |
| 6,550,531 | B1 * | 4/2003 | Searls | F28D 15/0233 165/104.26 |
| 6,639,799 | B2 * | 10/2003 | Prasher | H01L 23/427 165/80.4 |
| 6,889,755 | B2 * | 5/2005 | Zuo | F28D 15/046 165/104.21 |
| 7,411,790 | B2 * | 8/2008 | Huang | H01L 23/427 165/104.33 |
| 7,621,316 | B2 * | 11/2009 | Kawabata | F28D 15/0233 165/104.21 |
| 8,075,300 | B2 * | 12/2011 | Zinniel | B29C 71/0009 425/445 |
| 8,356,410 | B2 * | 1/2013 | Zhao | F28D 15/046 165/104.26 |
| 8,462,508 | B2 * | 6/2013 | Lankston, II | F28D 15/0233 361/689 |
| 8,590,154 | B2 * | 11/2013 | Lee | F28D 15/0233 29/527.1 |
| 8,934,235 | B2 * | 1/2015 | Rubenstein | G06F 1/206 165/185 |
| 9,333,599 | B2 * | 5/2016 | de Bock | B23P 15/26 |
| D825,498 | S * | 8/2018 | Allin | D13/179 |
| 2001/0032713 | A1 * | 10/2001 | Penn | B22C 7/023 164/34 |
| 2007/0017814 | A1 * | 1/2007 | Hwang | C25D 1/08 205/118 |
| 2007/0187069 | A1 * | 8/2007 | Ueno | F28D 15/0275 165/80.3 |
| 2008/0087405 | A1 * | 4/2008 | Meng | F28D 15/0283 165/104.26 |
| 2008/0236796 | A1 * | 10/2008 | Siu | F28D 15/0233 165/104.21 |
| 2009/0025910 | A1 * | 1/2009 | Hoffman | F28D 15/046 165/104.26 |
| 2009/0151906 | A1 * | 6/2009 | Lai | F28D 15/046 165/104.26 |
| 2009/0152713 | A1 * | 6/2009 | Sauciuc | H01L 23/3737 257/713 |
| 2009/0154113 | A1 * | 6/2009 | MacDonald | H05K 7/20518 361/720 |
| 2010/0018678 | A1 * | 1/2010 | Siu | F28D 15/046 165/104.26 |
| 2010/0089381 | A1 * | 4/2010 | Bolmer | F28D 20/02 126/263.01 |
| 2010/0307003 | A1 | 12/2010 | Hoffman et al. | |
| 2012/0091603 | A1 * | 4/2012 | Jenkins | B29C 33/26 264/1.24 |
| 2012/0211211 | A1 * | 8/2012 | Shih | F28D 15/0233 165/185 |
| 2012/0292792 | A1 * | 11/2012 | Jenkins | B29C 37/005 264/1.1 |
| 2013/0014916 | A1 * | 1/2013 | Wadley | E01C 11/26 165/104.21 |
| 2014/0083653 | A1 * | 3/2014 | Kempers | F28F 13/04 165/104.26 |
| 2014/0182132 | A1 * | 7/2014 | Chen | B23P 15/26 29/890.03 |
| 2014/0363305 | A1 * | 12/2014 | Shah | B22D 19/16 416/241 R |
| 2015/0286256 | A1 * | 10/2015 | Delano | G06F 1/203 361/679.26 |
| 2015/0346784 | A1 * | 12/2015 | Delano | F28D 15/0233 361/679.47 |
| 2016/0165757 | A1 * | 6/2016 | Norton | H01L 23/3672 165/80.4 |
| 2016/0175923 | A1 * | 6/2016 | Liu | B22C 9/04 164/271 |
| 2016/0341884 | A1 * | 11/2016 | Jenkins | G02B 6/0065 |
| 2017/0049006 | A1 * | 2/2017 | McLaughlin | H05K 7/20336 |
| 2017/0142861 | A1 * | 5/2017 | McLaughlin | H05K 7/2039 |
| 2017/0277235 | A1 * | 9/2017 | Delano | G06F 1/1601 |
| 2017/0303433 | A1 * | 10/2017 | Delano | H04B 1/3827 |
| 2018/0050386 | A1 * | 2/2018 | Tallman | B22C 9/103 |
| 2018/0143673 | A1 * | 5/2018 | Jenkins | F28D 15/04 |
| 2018/0156545 | A1 * | 6/2018 | Delano | F28D 15/046 |
| 2018/0157297 | A1 * | 6/2018 | Delano | G06F 1/206 |
| 2018/0164042 | A1 * | 6/2018 | Stellman | B22C 9/02 |
| 2018/0239404 | A1 * | 8/2018 | Siddiqui | G06F 1/203 |

OTHER PUBLICATIONS

Kang, Sukhvinder S., "Advanced Cooling for Power Electronics", In Proceedings of 7th International Conference on Integrated Power Electronics Systems, Mar. 6, 2012, 3 pages.
Boreyko, et al., "Vapor chambers with jumping-drop liquid return from superhydrophobic condensers", In International Journal of Heat and Mass Transfer, vol. 61, Jun. 2013, 2 pages.
Celsia, "One-Piece Vapor Chamber, Surprisingly Affordable Heat Spreader". Celsia Inc. Retrieved: Dec. 8, 2016 Available at: http://celsiainc.com/vapor-chamber-one-piece-design/.
"International Search Report and Written Opinion Issued in PCT Application No. PCT/US2017/064392", dated Jun. 28, 2018, 17 pages.

\* cited by examiner

LOST WAX CAST VAPOR CHAMBER DEVICE

BACKGROUND

Vapor chambers are used to draw heat away from heat generating electronic components in many electronic devices. A working fluid within the vapor chamber travels in a loop, evaporating near a heat source and traveling away from the heat source to a condensing region, then returning via capillary action to the heat source. Heat is stored in the working fluid during evaporation, carried by the working fluid, and then dissipated during condensation. In this manner, the electronic device may be cooled. As electronic devices become increasingly smaller and thinner, vapor chambers are subjected to tighter thickness constraints. Manufacturing vapor chambers for such applications presents many challenges, as discussed below.

SUMMARY

A vapor chamber device is provided. The vapor chamber may be a lost wax cast chamber encapsulating a mesh. A meltable core may be formed from a meltable core material, with the mesh positioned at least partially inside the core. A metallic layer may be formed on the meltable core, at least partially surrounding the meltable core. Melting the meltable core causes it to be removed from within the metallic layer, exposing a chamber formed by the metallic layer with an internal void left by the melting of the meltable core. Melted material flows out an opening on at least one surface of the chamber. The chamber encapsulates the mesh within the void, which is at least partially filled with a working fluid. The chamber opening is subsequently closed.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

The inventors have recognized certain challenges of manufacturing vapor chambers using conventional methods. A typical vapor chamber may be formed by diffusion bonding plates. This presents the difficulty of securing a reliable bond line between the plates being bonded to form the chamber; a wide bond is more reliable but diminishes the internal volume of the chamber. The inventors conceived that the internal volume may be increased by eliminating the bond line altogether. The contact area between the vapor chamber and heat generating electronics may also be prone to deformation, particularly when the plates forming the vapor chamber are thin. Less efficient heat transfer can occur at the interface of the vapor chamber and heat generating electronics, as well as at soldered joints between the vapor chamber and adjoining heat pipes. A vapor chamber that can be formed to better accommodate the surfaces and space around the heat generating electronics and be formed in unity with heat pipes would be advantageous given these problems. A convex surface can form in a lower plate of the vapor chamber positioned on a planar top of the heat generating electronics, such that a gap is formed between the two, resulting in less efficient heat transfer from the heat generating electronics to the vapor chamber.

Furthermore, maximizing power dissipation by the vapor chamber while keeping it compact presents design challenges. It can be a challenge to design a vapor chamber that has both consistent power output and the ability to dissipate large transient energy loads. Further, vapor chambers are placed under vacuum, and can be vulnerable to collapse due to atmospheric pressure when they are formed to be plate-like and thin.

Figure 1:
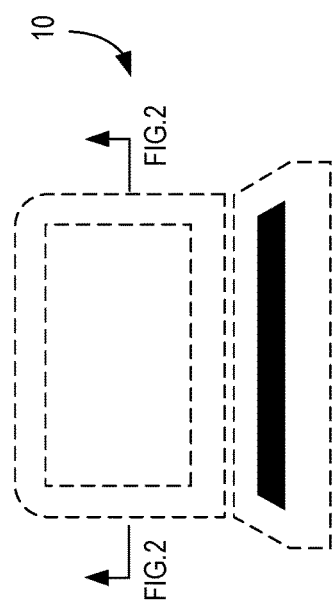
FIG. 1 is a front view showing an electronic device housing heat generating electronic components from which a vapor chamber device within the electronic device directs heat.
Figure 2:
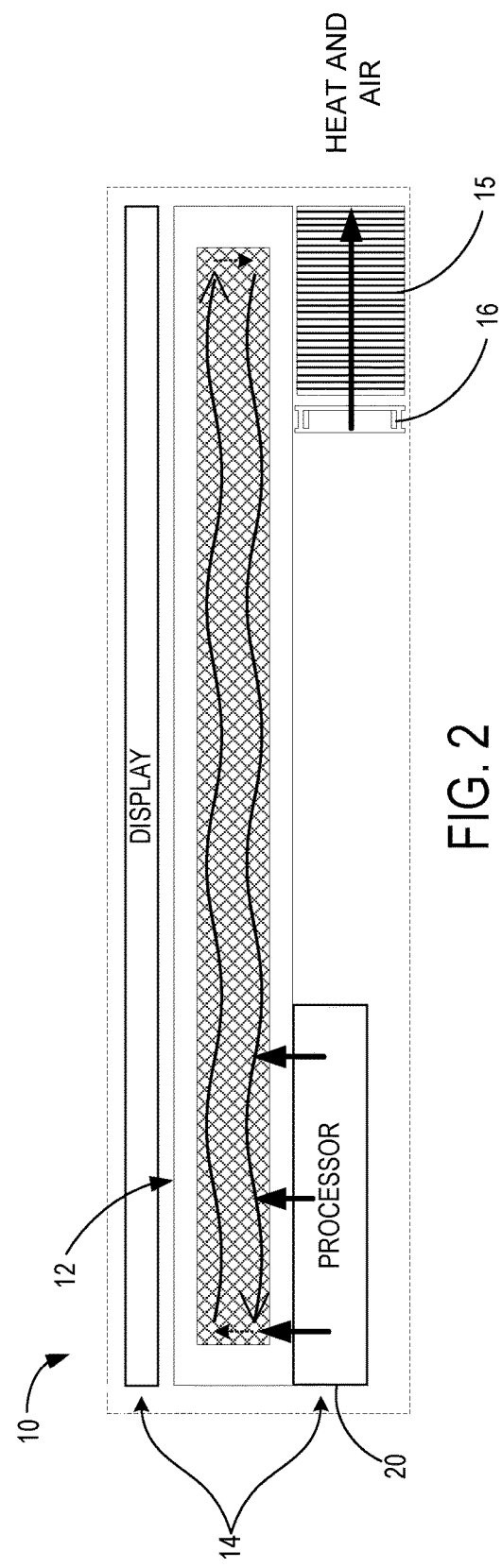
FIG. 2 is a section view showing a cross-section of the electronic device of FIG. 1 with the electronic components and vapor chamber device detailed.

To address these challenges recognized by the inventors and discussed above, a vapor chamber design for an electronic device is provided, which is manufactured using a lost wax process. FIGS. 1-2 depict an electronic device 10 housing heat generating electronic components 14 which a vapor chamber device 12 within the electronic device 10 cools, according to an implementation of the present disclosure. The electronic device 10 may be a laptop computer as shown in FIG. 1, or may alternatively take a variety of other forms, such as a tablet computer, smart phone, automotive electronics, head mount device, wearable computing device, medical device, or any other device requiring the dissipation of a heat load.

FIG. 2 schematically illustrates a cross-section of the electronic device 10 including a vapor chamber device 12 moving heat from heat generating electronic component 14, which may be, for example, a processor 20 such as a CPU or GPU, or a display, or other electronic component. The vapor chamber device 12 may be adjacent to a heat sink 15 and fan 16 that may progress heat flow. To enable the vapor chamber device 12 to have a very thin thickness T as compared to its to elongate dimensions, a lost wax casting manufacturing process may be utilized to manufacture the vapor chamber device 12, which may leave behind an embedded mesh that provides structural support to buttress the top and bottom walls, especially, against the forces of atmospheric pressure.

As this configuration illustrates, the heat generating components 14 are often located a distance away from an edge of an electronic device 10, and thus the role of the vapor chamber device 12 is to move the heat away to a location where it may be dissipated to atmosphere outside the electronic device 10. Although a fan is depicted in FIG. 2, it will be appreciated that fan-less designs are also possible. Further, although a heat sink 15 is depicted, it will be appreciated that alternatively the end of the vapor chamber device 12 may be directly exposed to fan forced air or convection currents of air that draw heat from its flow within the electronic device 10 to the atmosphere. Although the vapor chamber device 12 is illustrated as rectangular in cross section in FIG. 2, it will be appreciated that myriad shapes are possible, as described below.

Figure 3:
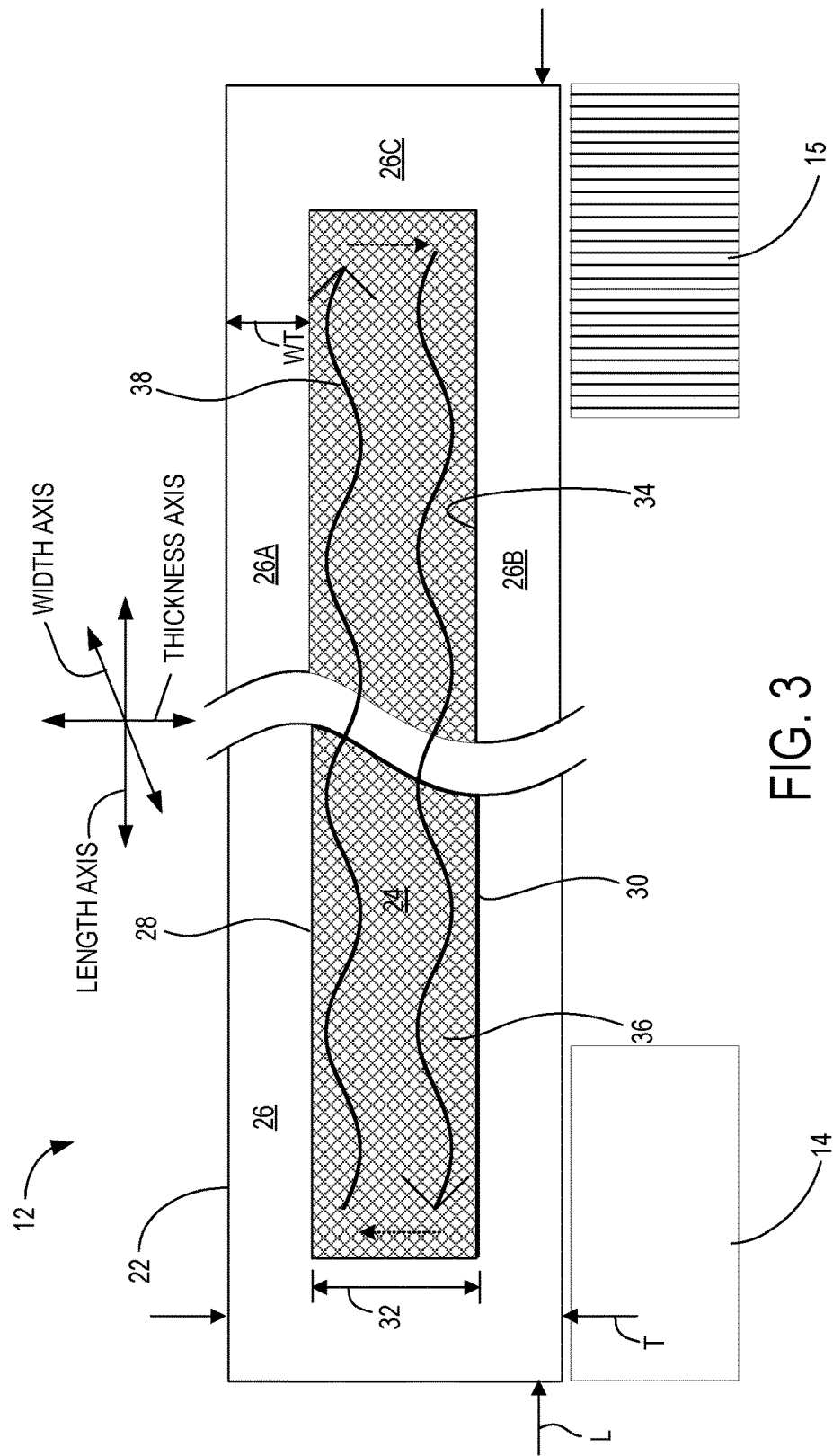
FIG. 3 is a section view illustrating the vapor chamber device and showing the flow direction of the working fluid in vapor form moving heat from a heat source towards a heat sink, and the flow direction of the working fluid in liquid form returning from the heat sink to the heat source.

FIG. 3 is a partial schematic view that illustrates schematically the heat generating electronic components 14, lost wax cast chamber 22, and heat sink 15 of the implementation of FIG. 2. As shown, the vapor chamber device 12 includes the lost wax cast chamber 22 encapsulating a mesh 24, the chamber 12 having a surrounding wall 26 including at least a first surface 28 and a second surface 30 separated by a distance 32. The surrounding wall 26 encloses an internal void 34 placed under vacuum, the mesh 24 filling a portion of the internal void 34 of the chamber 22 and supporting the first surface 28 and the second surface 30 against deformation under vacuum. The mesh 24 includes a porous structure 36 that facilitates capillary action of a working fluid 38 placed in the internal void 34 of the chamber. Additionally, the first surface 28 and the second surface 30 may be substantially parallel to each other, and the distance 32 separating the first surface 28 and second surface 30 may be substantially smaller than external dimensions, such as length L and width W of the lost wax cast chamber 22 in a pair of directions orthogonal to distance 32 (e.g., along the width axis and length axis shown in FIG. 3).

Vapor chamber device 12 may be formed using a lost wax casting manufacturing process. A meltable core material may be formed at least in part over a mesh 24. The meltable core material may be a wax or other material that may be removed during the manufacturing process by melting. As described below, a conductive layer may be formed on at least part of the meltable core material. The conductive layer may be electroplated or otherwise further covered at least in part by an additional metal or a plurality of metals; electroforming is another process that may be used. Subsequently, the meltable core material may be removed by melting. The remaining material forms a lost wax cast chamber 22 that encapsulates a mesh 24 at least in part. Additional manufacturing steps may be conducted as described below. A working fluid 38 may be introduced to the lost wax cast chamber 22 by way of an opening (see 50 in FIGS. 10-11) in one of the surfaces of the surrounding wall 26. The openings subsequently may be closed to complete formation of the vapor chamber device 12, as discussed below.

Heat expelled by the heat generating electronic component 14 is drawn into the vapor chamber device 12. The working fluid 38 in liquid form evaporates as heat is absorbed in the vicinity of the heat generating electronic component 14 in an evaporation region of the vapor chamber device 12. In vapor form, the working fluid 38 travels within the vapor chamber device 12 to a cooler condensation region distal the heat source. A heat sink 15 may be provided either in continuity with the vapor chamber device 12 or separately to draw heat from the working fluid 38 in vapor form and aid in its condensation. As the heat is drawn away, at the condensation region of the vapor chamber device 12, the working fluid 38 condenses back into a liquid form.

Subsequent to condensation, the working fluid 38 follows flow path within the vapor chamber device 12 that returns to the evaporation region proximate the heat source. To promote this return flow, the mesh 24 may be shaped to facilitate capillary action of the working fluid 38 in fluid form. In totality, the flow of the working fluid 38 follows a looped flow path within the vapor chamber device 12 to move heat from the heat generating electronic components 14 to where it may be dispelled external to the electronic device 10.

Figure 4:
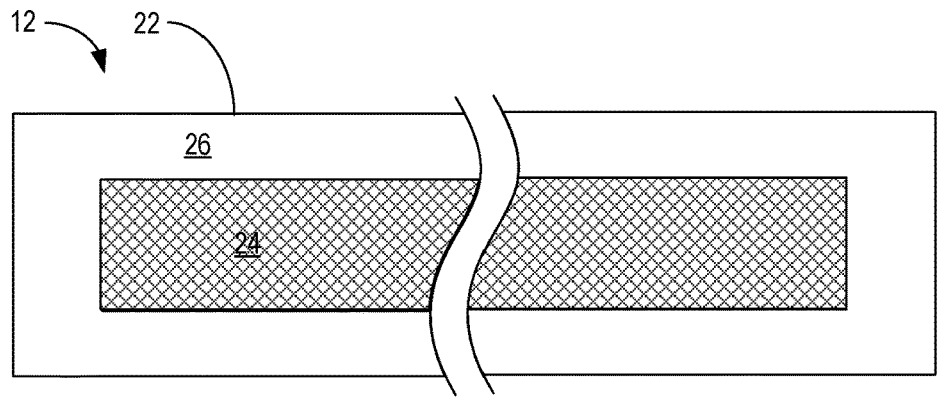
FIGS. 4-6 are section views depicting various different implementations of a vapor chamber, each illustrating a different configuration for a mesh within the vapor chamber device, where the mesh may be fully embedded in a surface, free-floating, or only partly embedded in a surface.
Figure 5:
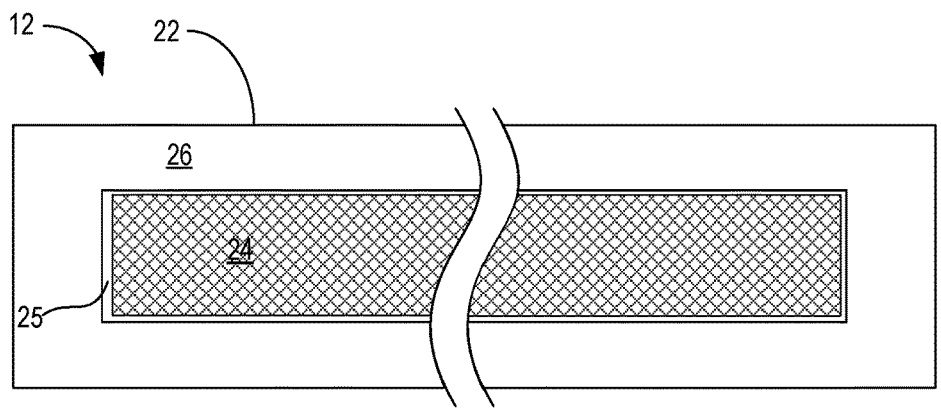
Figure 6:
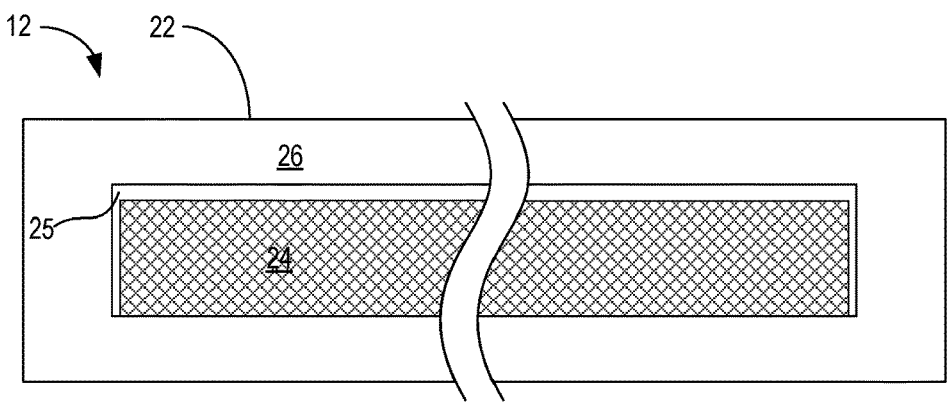

The mesh 24 may be encapsulated by the chamber 22 as shown in FIGS. 4-6, illustrating different configurations for a mesh 24 within the vapor chamber device 12. In FIG. 4, the mesh 24 may be fully embedded in the surrounding wall 26 of the chamber 22. In FIG. 5, the mesh 24 is free-floating and is not embedded in the surrounding wall 26. In this implementation, a small gap 25 may exist between the mesh 24 and the surrounding wall 26. In FIG. 6, the mesh 24 is only partly embedded in the surrounding wall 26, which may also reveal a small gap 25 where the mesh 24 is not embedded in the surrounding wall 26.

Figure 7:
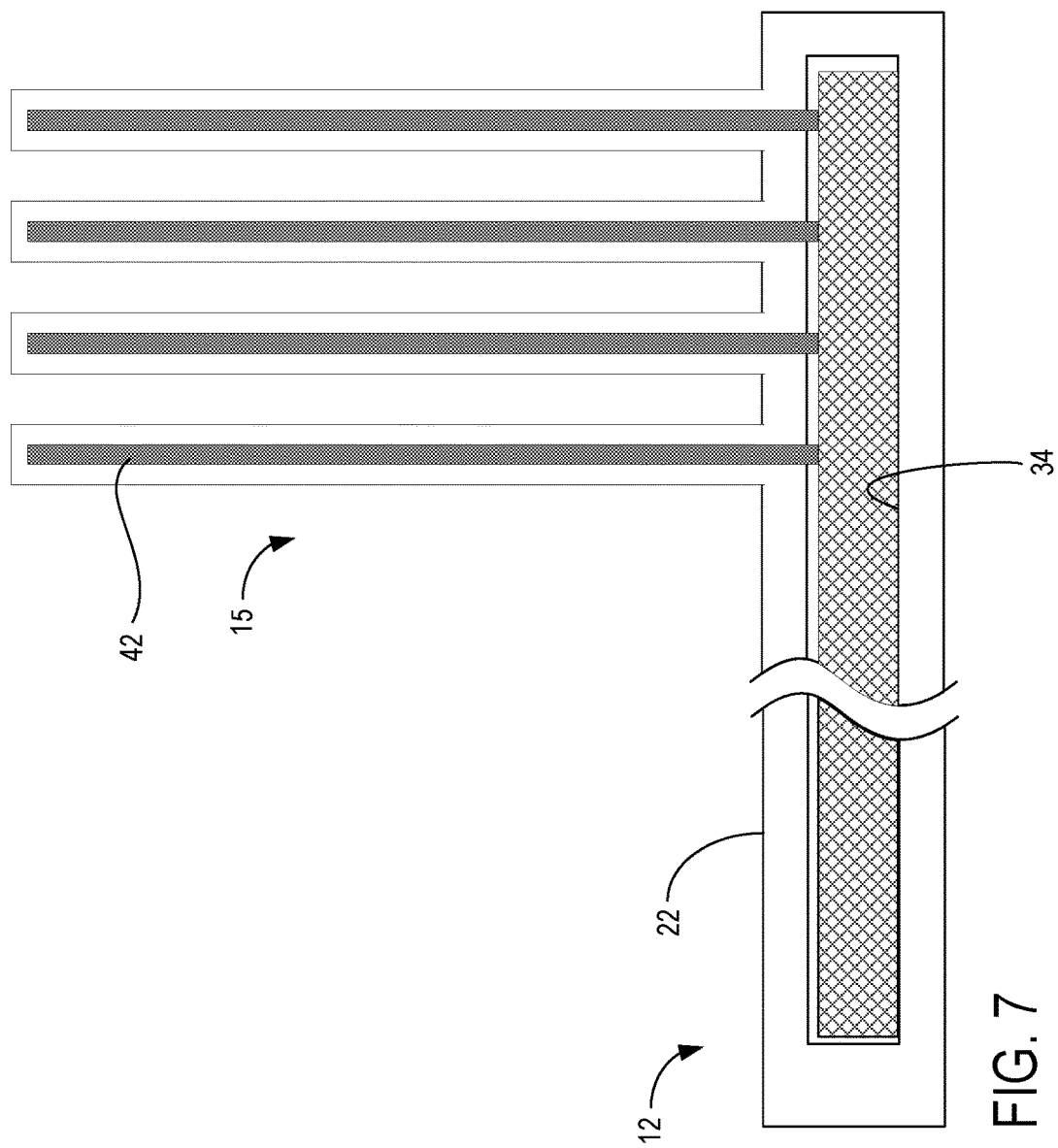
FIG. 7 is section view of an implementation of a vapor chamber device with a conductive metal structure that forms a heat sink and extends outwardly from an internal void of the chamber, where the chamber and heat sink are one continuous part.

In another implementation as shown in FIG. 7, a conductive metal structure 42 extends outwardly from the internal void 34 of the chamber 22 where the chamber 22 and conductive metal structure 42 are one continuous part. One potential advantage of this configuration is that the conductive metal structure 42 forms an extended heat sink 15 from the vapor chamber device 12, which efficiently transfers heat from the internal void to the fin-shaped conductive metal structure of the heat sink due to the direct connection of the heat sink fins to the chamber 22.

Figure 8:
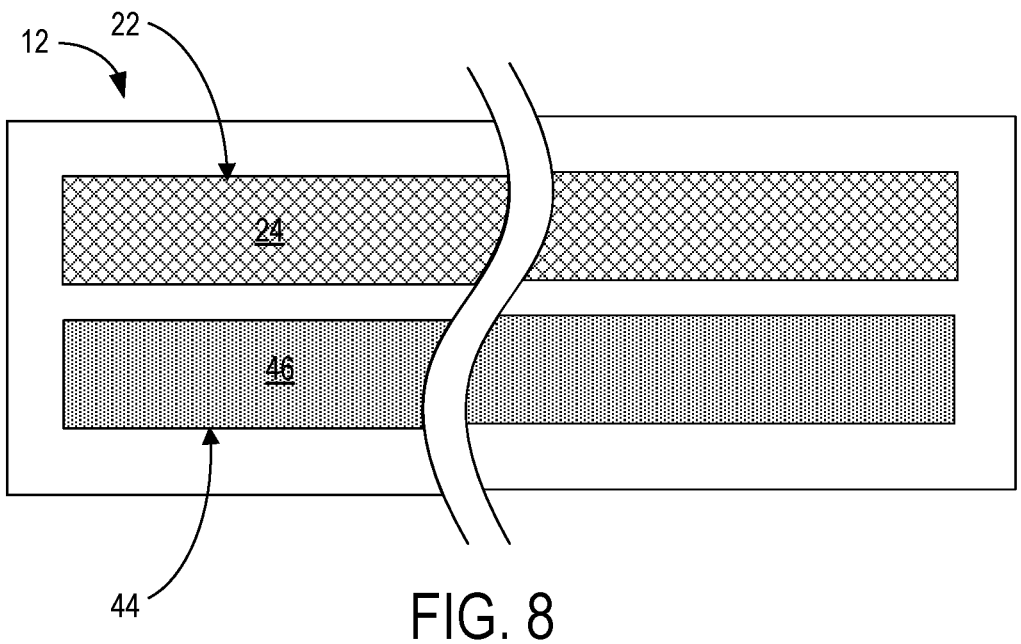
FIGS. 8-9 is a section view are different implementations of a vapor chamber device with more than one chamber, one chamber enclosing a mesh and another chamber enclosing another material that may be a phase change material, vacuum, or thermal insulator material.
Figure 9:
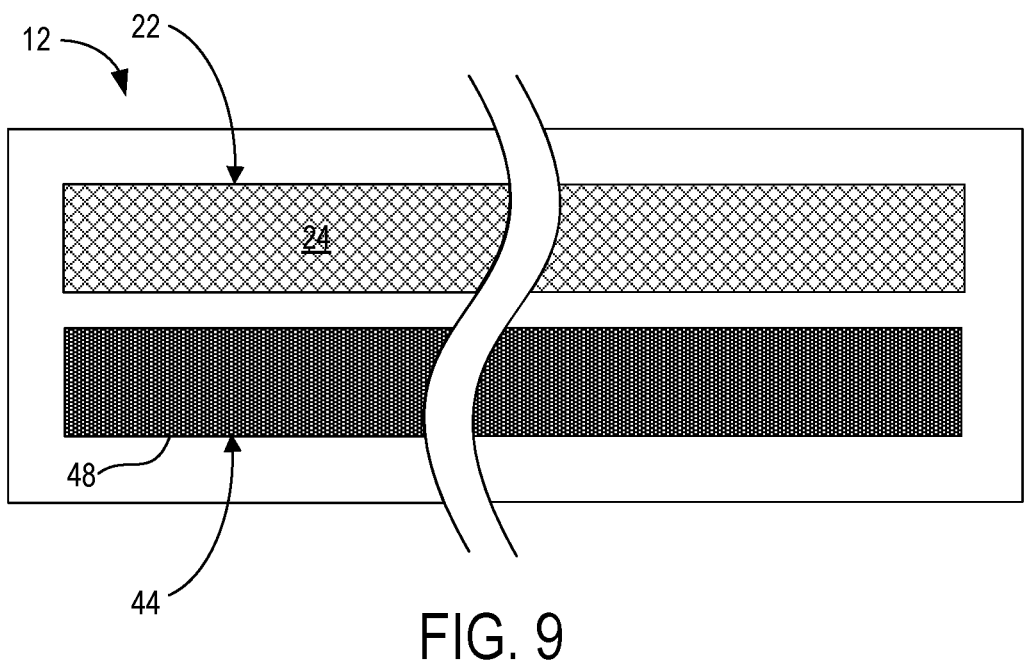

In another implementation as shown in FIGS. 8-9, the vapor chamber device 12 has a first chamber 22 that shares at least one common wall with a second chamber 44. Within the second chamber 44 may be the mesh 24, a phase change substance 46 with a phase change temperature that is within an operating temperature of the vapor chamber device 12, as shown in FIG. 8, or thermal insulation material 48, as shown in FIG. 9. In the example implementation of FIG. 8, the phase change substance 46 may include residual meltable core material (i.e., wax) remaining from the lost wax casting manufacturing process or other suitable material. In the example implementation of FIG. 9, the thermal insulation material 48 may be a range of materials that efficiently absorb heat at an operating temperature of the vapor chamber device 12.

A potential advantage of filling the second chamber 44 at least in part with a phase change substance 46 as shown in FIG. 8 is that transient heat loads, which for example may occur during peak processing periods, from the heat generating electronic components 14 may be mitigated. Should a transient heat load be generated, the phase change substance 46 may absorb the transient heat load by the process of phase change within chamber 44. For example, paraffin wax is an example material that may be used to absorb the transient heat load, since it has a solid-liquid phase change temperature that may be within an operating temperature of the electronic device 10. A potential advantage to this implementation is that the vapor chamber device 12 may reach thermal equilibrium over a longer period of time, lending a performance benefit to the vapor chamber device 12 because the vapor chamber device can continue cooling the electronic components even during the peak transient load. The phase change substance 46 may revert to its original phase upon cooling of the thermal system, as heat is gradually drawn away into atmosphere. Consequently, transient heat loads may be absorbed by the vapor chamber device 12 without excessive heat damaging other components of the electronic device 10.

An additional advantage of this configuration is that the presence of phase change substance 46 allows the device to cool without the necessity of fan operation until the heat capacity of the phase change is exceeded. This condition may occur, for example, when an electronic device 10 is powered on or for brief periods of operation. A device utilizing this configuration such as a mobile phone can be used transiently for short periods of time with quiet, non-mechanical cooling. Higher performance may be enabled with the additional operation of the vapor chamber and fans.

Alternatively, filling the second chamber 44 at least in part with thermal insulation material 48, as shown in FIG. 9, also may have potential advantages. These include minimizing heat accumulation on the outer surface of electronic device 10, protecting a user from higher heat exposure. Heat within the vapor chamber device 12 may be more easily confined to the internal void 34 in the presence of thermal insulation material 48, and/or caused to thermally dissipate out surfaces of the vapor chamber device 12 that are not bordered by the thermal insulation material (such as up and to the sides FIG. 9).

Figure 10:
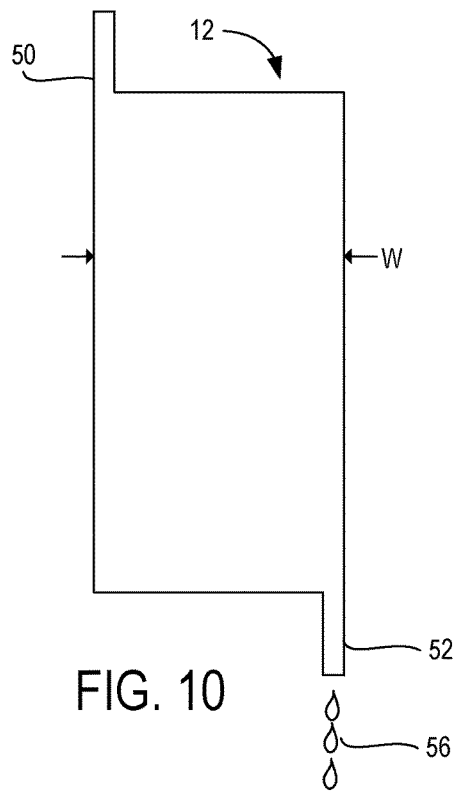
FIG. 10 is a top view of a vapor chamber device in a state in which it includes a fill port and a bleed port part. This state of the vapor chamber device is used during a manufacturing step in which meltable core material is caused to flow out of the bleed port. Following this step, working fluid can be introduced to the chamber via the fill port.
Figure 11:
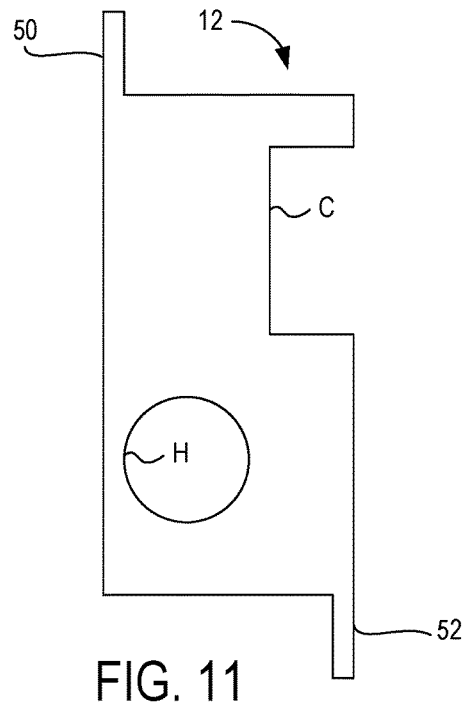
FIG. 11 is a top view of an irregularly shaped chamber with a fill port and bleed port used in the same manner as those of FIG. 10.
Figure 12:
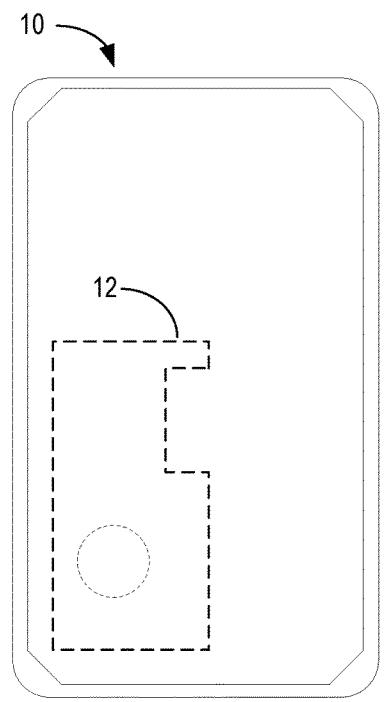
FIG. 12 is a top view of a vapor chamber device having an irregular form within an electronic device.

FIG. 10 depicts a form of the vapor chamber device 12 during an intermediate manufacturing step, with a fill port 50 and a bleed port 52 part of the chamber. The vapor chamber device 12 may be manufactured by lost wax manufacturing process, in which a meltable core material 56 remains after the walls of the vapor chamber device 12 are produced. The meltable core material 56 may flow out of the bleed port 52 when heated beyond its melting point. The chamber may then be flushed and a working fluid may be introduced to the chamber via the fill port 50. FIG. 11 illustrates a vapor chamber device with a fill port 50 and bleed port 52 like the implementation of FIG. 10, but the implementation of FIG. 11 shows that the vapor chamber device 12 may be manufactured to have an irregular form, including a hole H formed in the middle of the vapor chamber device, and a concavity C formed in the side. One potential advantage of this configuration is that the vapor chamber device 12 may have a form that occupies space around obstructions within electronic device 10, as shown in FIG. 12.

Figure 13:
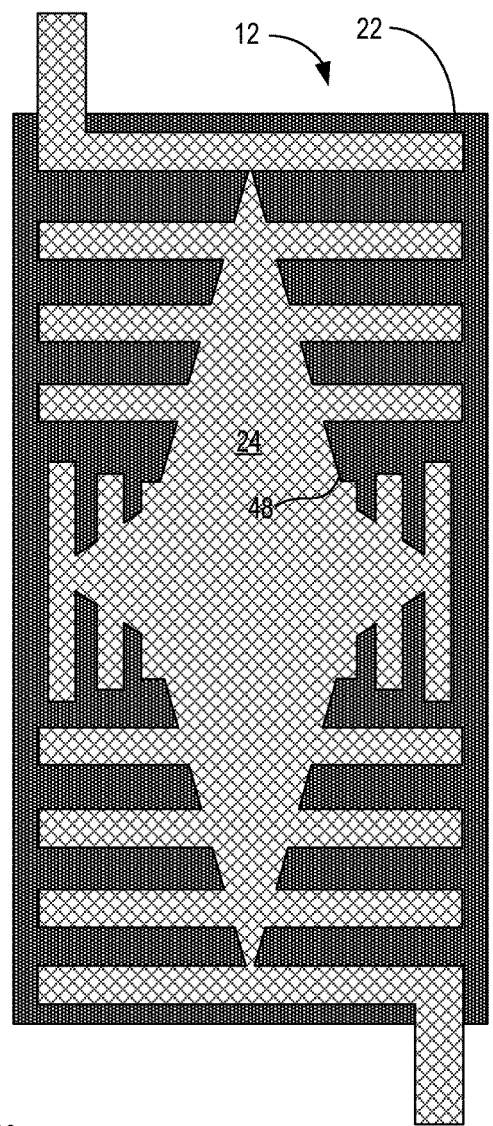
FIG. 13 is a cross sectional view taken from above of a vapor chamber device having an intricate internal configuration.

FIG. 13 is a top view of an implementation of a vapor chamber device 12 with a chamber 22 having an intricate structure with tortuous volumes formed therein within which mesh 24 may be positioned. The bounds of the tortuous volumes may be defined by suitably positioned thermal insulation material 48.

Figure 14:
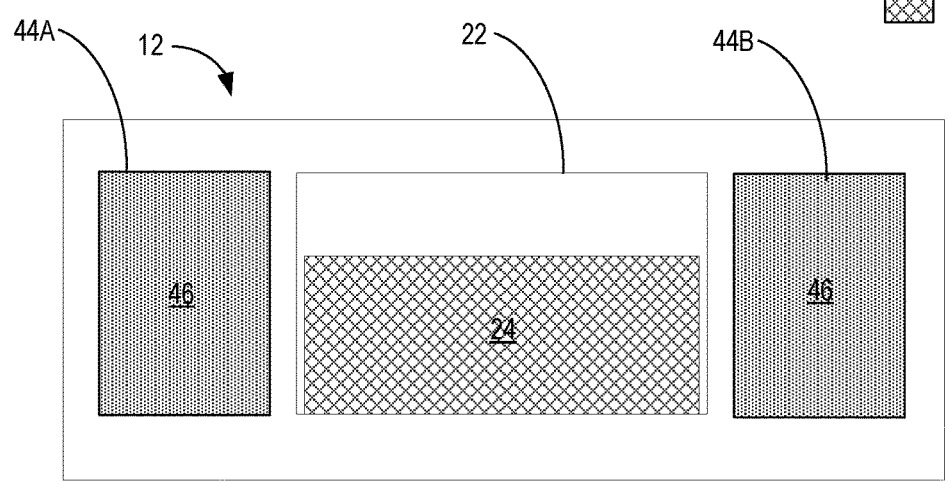
FIG. 14 is a section view of a vapor chamber device with more than one chamber, each chamber including either mesh or a vacuum or thermal insulator material.

FIG. 14 is a section view of a vapor chamber device 12 with a plurality of chambers 22, 44A, 44B, each chamber including either mesh 24, in the case of chamber 22, or a phase change substance 46, in the case of chambers 44A and 44B, with a phase change temperature that is within an operating temperature of the vapor chamber device 12. The positioning of the chambers 44A and 44B in this way has the potential advantage of directing movement of heat in a particular flow path (upwards or downwards in the FIG. 14) that may prevent inhibit excessive heat from damaging fragile components on the left or right of the vapor chamber device 12.

Figure 15:
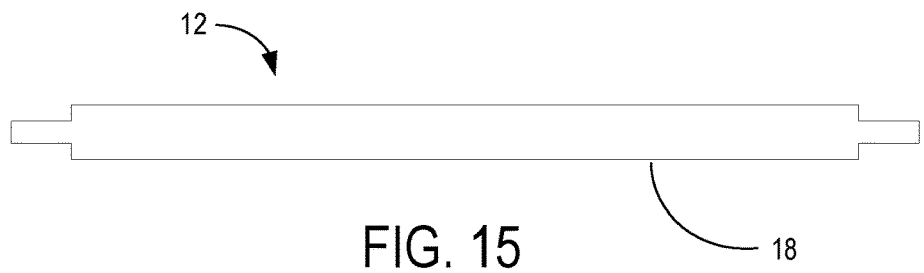
FIGS. 15-17 show a vapor chamber device in the form of a heat pipe that may be formed along one length dimension or deviate from the length direction so as to be positioned around obstructions such as electronic components.
Figure 16:
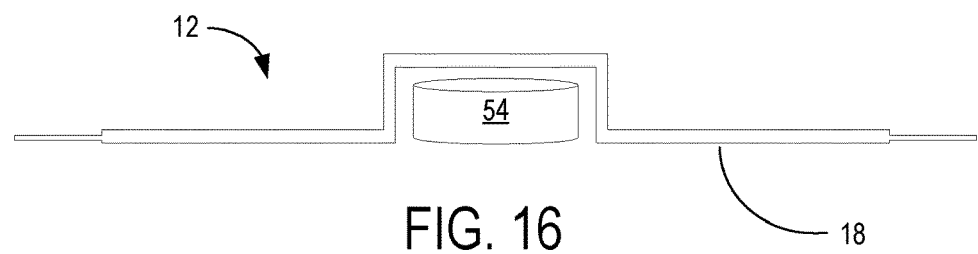
Figure 17:
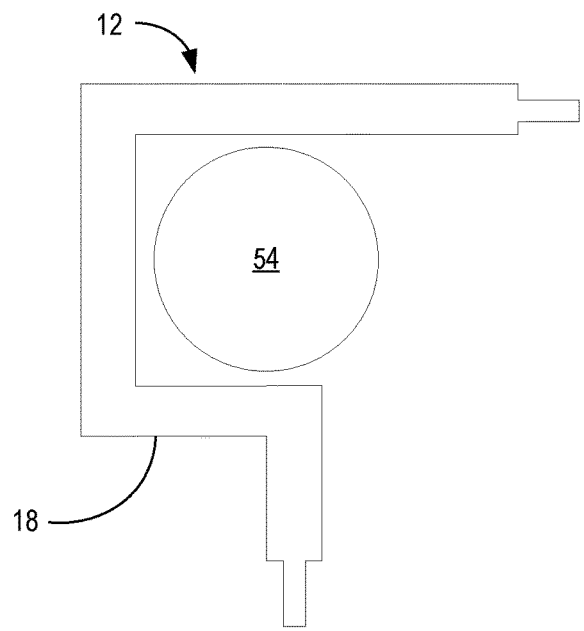

FIGS. 15-17 show a vapor chamber device 12 in the form of a heat pipe 18 that may be formed along one length dimension, as shown FIG. 15, or deviate from the length direction in a circuitous fashion so as to circumnavigate around an obstruction 54, as shown in FIGS. 16 and 17. One potential advantage of the vapor chamber device 12 having the configuration of heat pipe 18 is that heat may be directed by the heat pipe 18 away from sources of heat around obstructions 54, facilitating installation of the heat pipe 18 in the tight and intricate confines of a modern electronic device 10.

Figure 19:
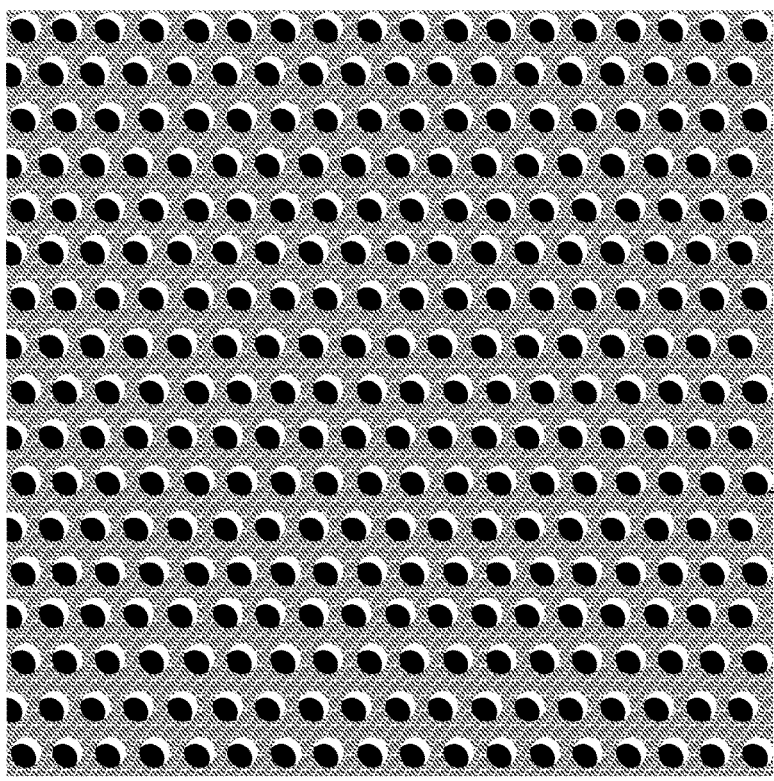
FIG. 19 is a three-dimensional porous membrane mesh according to an example implementation.
Figure 18:
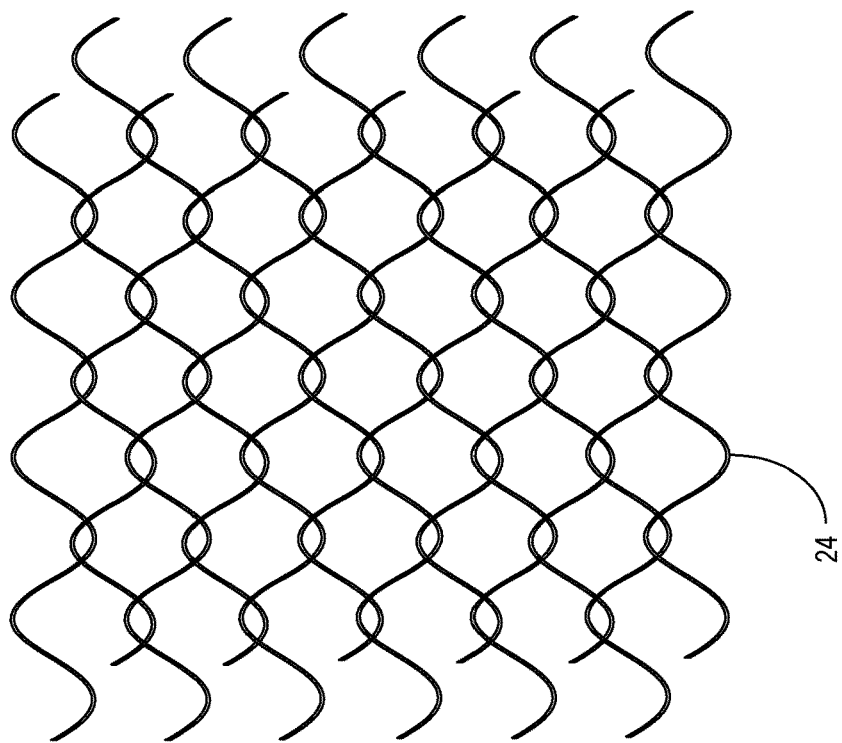
FIG. 18 is a three-dimensional chain link mesh according to an example implementation.

FIG. 18 is the mesh 24 including a three-dimensional chain-link form, according to an example implementation. The mesh 24 may have a three-dimensional porous membrane form as shown in FIG. 19. Additionally, the mesh 24 may be a three-dimensional lattice and may have a plurality of forms. The mesh 24 may be composed of one or more materials such as a metal, a polymer, and a natural fiber material.

The dimensions of vapor chamber device 12 will now be discussed. Referring to FIG. 3, the vapor chamber device 12 may have a surrounding wall 26 comprised of a top wall portion 26A, bottom wall portion 26B and sidewall portions 26C. The top and bottom wall portions 26A, 26B may have a wall thickness WT of at least 0.15 mm, and the sidewall portions 26C may be formed to have the same or larger thickness as the top and bottom wall portions 26A and 26B. The vapor chamber device 12 may have an internal void 34 that is dimensioned so as to have a minimum internal distance 32 of 0.30 mm or greater. The vapor chamber device may have a maximum outer dimensional length L and width W (see FIG. 10) of 100 mm, and an outer dimensional thickness T of from 0.6 mm up to 100 mm (see FIG. 3). The area including the length L and width W of the lost wax cast chamber 22 in a pair of directions orthogonal to distance 32 may be selected as desired for the application, and may range from a few square centimeters to 50 $cm^2$, or more.

In the example implementation of the vapor chamber device 12 illustrated in FIG. 7, the heat sink 15 formed as one continuous part with the lost wax cast chamber 22, the heat sink 15 may have a dimension of 2-10 mm extending away from the chamber 22. In the examples illustrated in FIGS. 8 and 9, the vapor chamber device 12 has a first chamber 22 over a second chamber 44 in the thickness T direction that share a common wall, and the overall outer thickness of the vapor chamber device 12 may be, for example, 0.9 mm or greater. The vapor chamber device 12 in the form of a heat pipe 18 may have a length L of 100 and a thickness T of 0.6 mm to 12 mm, as one specific example.

Figure 20:
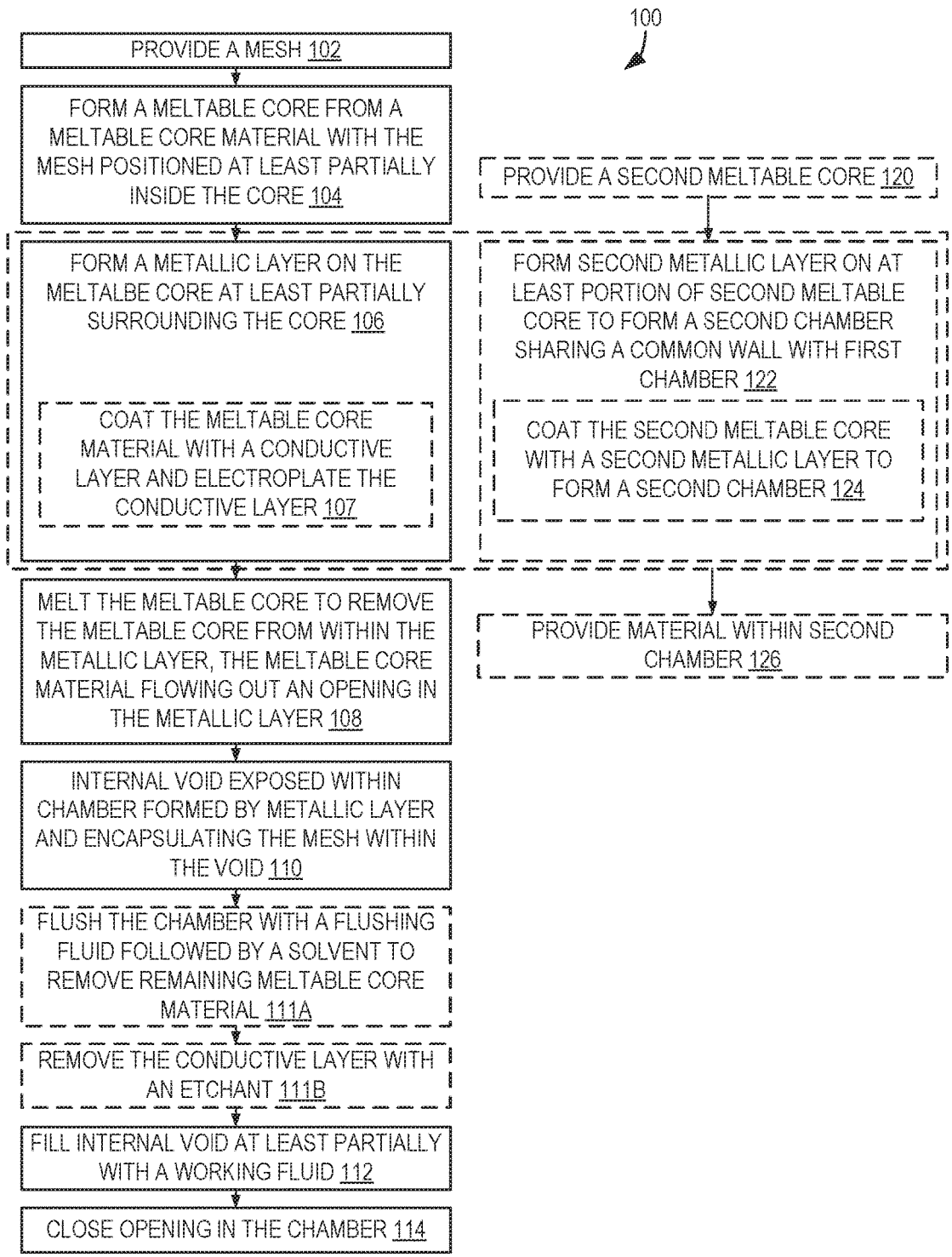
FIG. 20 is a flowchart of a method for manufacturing a vapor chamber device, according to an example implementation.

FIG. 20 illustrates a method 100 for manufacturing a vapor chamber device 12 with a mesh 24 by a lost wax method that produces a lost wax cast chamber 22. At 102, the method includes providing a mesh 24. The mesh 24 may be provided to facilitate capillary flow in the working vapor chamber device 12. At 104, the method further includes forming a meltable core from a meltable core material 56 with the mesh 24 positioned at least partially inside the core. A heat sink 15 may be formed as part of the vapor chamber device 12, in which case at this juncture of manufacture a conductive metal structure 42 is coupled to the meltable core material.

The method at 106 further includes forming a metallic layer on the meltable core at least partially surrounding the core. The coating on the meltable core material may be a conductive layer. Metallic paint spray, vapor deposition, or another method may be used to provide the conductive layer. Electroplating the conductive layer at 107 is an example of the method where a metallic layer is formed on the meltable core; electroforming is another process that may be used. The metallic layer may be nickel, copper, silver, a metal bilayer, or other configuration of metal formation on the meltable core material. If applicable, the conductive metal structure 42 is also plated.

At 108, the method further includes melting the meltable core to remove the meltable core from within the metallic layer. The meltable core material 56 flows out an opening in the metallic layer, which may be a bleed port 52 and the meltable core removed by way of through-flow. The method at 110 further includes forming an internal void 34 exposed within the lost wax cast chamber 22 formed by the metallic layer, the mesh 24 encapsulated within the internal void 34. If a heat sink 15 is formed as part of the vapor chamber device 12, the conductive metal structure 42 will extend outwardly from the internal void 34.

In addition to the internal void 34 of chamber 22 described in the method at 110, the method 100 may include manufacturing the vapor chamber device 12 to have a plurality of lost wax cast chambers 22. In this example, the meltable core is a first meltable core and the method further comprises providing a second meltable core at 120. A mesh 24 may be positioned at least partly inside the second meltable core. The second meltable core may be coated at 124 with a second metallic layer to form a second lost wax cast chamber 44 at 122. The first chamber 22 and second chamber 44 may share a common wall.

Further, prior to introducing any additional material such as working fluid 38 to the vapor chamber device 12, the manufacturing method 100 may include the internal void 34 being flushed with a flushing fluid that may further be followed by application of a solvent at 111A. This or another method may be used to remove remaining meltable core material from the internal void 34. Should a conductive layer have been applied to the meltable core material, it may be removed by way of an etchant at 111B. The etchant may be a solvent or other substance that does not remove the mesh 24.

At 112, the method further includes filling the internal void 34 at least partially with a working fluid 38. The working fluid 38 may be introduced to the lost wax cast chamber 22 by a fill port 50. It will be appreciated that an internal void 34 of a chamber 22 may alternatively encapsulate at least in part a phase change substance 46 with a phase change temperature that is within an operating temperature of the vapor chamber device 12. Thermal insulation material 48 may also be encapsulated by an internal void 34.

The method at 114 further includes closing the opening in the lost wax cast chamber 22. This may be accomplished by screwing a fill cap to the fill port and bleed port respectively, soldering these ports shut, etc.

As described above, the mesh 24 may be composed of metal, polymer, or natural fiber material. Alternatively, other material or a combination of materials may also be used for the mesh 24. According to an implementation, the mesh 24 rendered by method 100 may include a three-dimensional chain-link form; in another implementation the mesh 24 may have a three-dimensional porous membrane form. The mesh 24 may also be a three-dimensional lattice. The mesh 24 may alternatively have a plurality of forms as described above.

According to the vapor chamber device 12 configuration as described, heat is drawn way from heat generating electronic components 14. The continual removal of heat during operation of the vapor chamber device 12 is dependent on the looped circulation of working fluid through the internal void 34. For increasingly thin and compact electronic devices 10, the operation of the vapor chamber device 12 with an interior under vacuum depends on maintaining structural integrity against atmospheric pressure. The configuration of the lost wax cast chamber 22 described above with inclusion of a mesh 24 that provides structural support while facilitating capillary flow of working fluid 38 promotes cooling while retaining sufficient structural stability. Manufacturing vapor chamber device 12 using the lost wax casting process allows a continuous chamber to be constructed and thereby aids in controlling potential deformation that may otherwise arise in bonded plates.

The continuity of multiple chambers as an essential outcome of the lost wax casting process also supports having adjacent chambers encapsulating phase change substance 46 and thermal insulation material 48 buffer the flux of heat through the vapor chamber device 12, avoiding heat flux into the electronic device 10. As described, the lost wax cast process of manufacture enables the vapor chamber device 12 to be manufactured to increasingly small thicknesses while maintaining efficient heat transfer. Further, the planar nature of the surrounding wall 26 especially in the top wall portion 26A and bottom wall portion 26B may be promoted, thereby reducing gaps between planar surfaces of adjacent heat generating components and promoting efficient heat transfer therebetween.

The following paragraphs provide additional support for the claims of the subject application. One aspect provides a method for manufacturing a vapor chamber, the method comprising providing a mesh, forming a meltable core from a meltable core material, the mesh being positioned at least partially inside the core; forming a metallic layer on the meltable core, the metallic layer at least partially surrounding the meltable core; melting the meltable core to cause it to be removed from within the metallic layer, and thereby expose a chamber formed by the metallic layer with an internal void left by the melting of the meltable core. Melted material from the meltable core flows out an opening on at least one surface of the chamber, the chamber encapsulating the mesh within the void. The internal void is filled at least partially with a working fluid, and the opening in the chamber s closed.

In this aspect, additionally or alternatively, the meltable core material may be coated with a conductive layer and the conductive layer may be electroplated. In this aspect, additionally or alternatively, the meltable core material may be removed by way of a through-flow bleed port to expose the internal void of the chamber. In this aspect, additionally or alternatively, the chamber may be flushed with a flushing fluid followed by a solvent to remove remaining meltable core material. In this aspect, additionally or alternatively, the conductive layer may be removed with an etchant.

In this aspect, additionally or alternatively, a heat sink may be formed by coupling a conductive metal structure to the meltable core material prior to melting; plating additionally may include plating the conductive metal structure and following plating, the plated conductive metal structure may form a heat sink that extends outwardly from the internal void.

In this aspect, additionally or alternatively, the meltable core may be a first meltable core and the method may further comprise providing a second meltable core; the second meltable core may be coated with a second metallic layer to form a second chamber. The second chamber and the first chamber may share a common wall. In this aspect, additionally or alternatively, within the second chamber there may be provided a material at 126 of at least one of the group consisting of the mesh, a substance with a phase change temperature that is within an operating temperature of the vapor chamber, and thermal insulation material.

In this aspect, additionally or alternatively, the mesh may be composed of one or more materials selected from the group consisting of metal, a polymer, and a natural fiber material. In this aspect, additionally or alternatively, the mesh may be formed in a shape selected from the group consisting of a three-dimensional lattice, three-dimensional chain-link form, and three-dimensional porous membrane. In this aspect, additionally or alternatively, the internal void may have an internal dimensional thickness of at least 0.30 mm and a surrounding wall thickness of at least 0.15 mm.

Another aspect provides a vapor chamber device, comprising a mesh and a lost wax cast chamber encapsulating the mesh, the chamber having a surrounding wall including at least a first surface and a second surface separated by a distance. The surrounding wall encloses an internal void placed under vacuum, and the mesh fills a portion of the internal void of the chamber and supports the first surface and the second surface against deformation under vacuum. The mesh includes a porous structure that facilitates capillary action of a working fluid placed in the internal void of the chamber.

In this aspect, additionally or alternatively, the vapor chamber device may comprise the first surface and the second surface being substantially parallel to each other, and the distance separating the first surface and second surface being substantially smaller than external dimensions of the chamber in a pair of directions orthogonal to the distance.

In this aspect, additionally or alternatively, the vapor chamber device may comprise a conductive metal structure that forms a heat sink and extends outwardly from the internal void of the chamber, where the chamber and heat sink are one continuous part. In this aspect, additionally or alternatively, the chamber may be a first chamber that shares at least one common wall with a second chamber. In this aspect, additionally or alternatively, within the second chamber may be a material of at least one of the group consisting of the mesh, a substance with a phase change temperature that is within an operating temperature of the vapor chamber, and thermal insulation material.

In this aspect, additionally or alternatively, the mesh may be composed of one or more materials selected from the group consisting of metal, a polymer, and a natural fiber material. In this aspect, additionally or alternatively, the mesh may be formed in a shape selected from the group consisting of a three-dimensional lattice, three-dimensional chain-link form, and three-dimensional porous membrane. In this aspect, additionally or alternatively, the internal void may have an internal dimensional thickness of at least 0.30 mm and a surrounding wall thickness of at least 0.15 mm.

Another aspect provides a vapor chamber device, comprising a mesh and a chamber surrounding the mesh, the chamber formed by forming a meltable core from a meltable core material, the mesh being positioned at least partially inside the meltable core; forming a metallic layer on the meltable core, the metallic layer at least partially surrounding the meltable core; melting the meltable core to cause it to be removed from within the metallic layer and thereby expose a chamber formed by the metallic layer with an internal void left by the melting of the meltable core. Melted material from the meltable core flows out an opening on at least one surface of the chamber, the chamber encapsulating the mesh within the void. The internal void is filled at least partially with a working fluid, and the opening in the chamber is closed.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method for manufacturing a vapor chamber, the method comprising:
    providing a mesh;
    forming a meltable core from a meltable core material, the mesh being positioned at least partially inside the meltable core;
    forming a metallic layer on the meltable core, the metallic layer at least partially surrounding the meltable core;
    melting the meltable core to cause it to be removed from within the metallic layer, and thereby expose a chamber formed by the metallic layer with an internal void left by the melting of the meltable core, melted material from the meltable core flowing out of an opening on at least one surface of the chamber, the chamber encapsulating the mesh within the internal void;
    filling the internal void at least partially with a working fluid; and
    closing the opening in the chamber,
    wherein the meltable core is a first meltable core and the method further comprises:
    providing a second meltable core;
    forming a second metallic layer on at least a portion of the second meltable core to form a second chamber, the second chamber and the first chamber sharing a common wall; and providing a material within the second chamber that differs from materials within the first chamber, the material within the second chamber including a substance with a phase change temperature or a thermal insulation material.

2. The method of claim 1, further comprising:
coating the meltable core material with a conductive layer; and
electroplating the conductive layer.

3. The method of claim 1, further comprising removing the meltable core material by way of a through-flow bleed port to expose the internal void of the chamber.

4. The method of claim 1, further comprising flushing the chamber with a flushing fluid followed by a solvent to remove remaining meltable core material.

5. The method of claim 2, further comprising removing the conductive layer with an etchant.

6. The method of claim 1, further comprising forming a heat sink by coupling a conductive metal structure to the meltable core material prior to melting, and wherein
plating additionally includes plating the conductive metal structure;
wherein, following plating, the plated conductive metal structure forms the heat sink that extends outwardly from the internal void.

7. The method of claim 1, wherein the mesh is composed of one or more materials selected from the group consisting of metal, a polymer, and a natural fiber material.

8. The method of claim 1, wherein the mesh is formed in a shape selected from the group consisting of a three-dimensional lattice, three-dimensional chain-link form, and three-dimensional porous membrane.

9. The method of claim 1, wherein the internal void has an internal dimensional thickness of at least 0.30 mm and a surrounding wall thickness of at least 0.15 mm.

10. A vapor chamber device, comprising:
a mesh defining a three-dimensional volume;
a chamber surrounding the mesh, wherein the chamber is formed by:
forming a meltable core from a meltable core material, the mesh being positioned at least partially inside the meltable core, the meltable core including a layer portion that covers at least a portion of an exterior surface of the three-dimensional volume of the mesh;
forming a metallic layer on the meltable core including at least on an exterior of the layer portion of the meltable core, the metallic layer at least partially surrounding the meltable core;
melting the meltable core to cause it to be removed from within the metallic layer, and thereby expose the chamber formed by the metallic layer with an internal void left by the melting of the meltable core, the internal void including a gap between the portion of the exterior surface of the mesh and the metallic layer, melted material from the meltable core flowing out of an opening on at least one surface of the chamber, the chamber encapsulating the mesh within the internal void;
filling the internal void at least partially with a working fluid; and
closing the opening in the chamber.

* * * * *